(12) United States Patent
Chen

(10) Patent No.: US 6,251,804 B1
(45) Date of Patent: Jun. 26, 2001

(54) METHOD FOR ENHANCING ADHESION OF PHOTO-RESIST TO SILICON NITRIDE SURFACES

(75) Inventor: Chung-Chih Chen, Taipei (TW)

(73) Assignee: United Microelectronics Corp., Hsin-chu (TW)

( * ) Notice: Subject to any disclaimer, the term of this patent is extended or adjusted under 35 U.S.C. 154(b) by 0 days.

(21) Appl. No.: 09/576,134

(22) Filed: May 22, 2000

(51) Int. Cl.[7] .................................................. H01L 21/469
(52) U.S. Cl. .............................. 438/778; 438/4; 438/585; 438/948; 438/974
(58) Field of Search ........................... 438/4, 585, 628, 438/769, 770, 773, 948, 974, 778

(56) References Cited

U.S. PATENT DOCUMENTS 4,330,569 * 5/1982 Gulett et al. ........................ 427/28
5,714,037 * 2/1998 Puntambekar et al. ........... 156/643.1
5,783,365 * 7/1998 Tsujita ................................... 430/311

* cited by examiner

Primary Examiner—Trung Dang
(74) Attorney, Agent, or Firm—Winston Hsu

(57) ABSTRACT

A method for enhancing adhesion of photo-resist to silicon nitride surfaces is disclosed. An oxidation process is first performed on the surface of the semiconductor wafer using ozone-dissolved deionized water to transform most of the dangle bonds and Si-N bonds on the surface of the silicon nitride layer into Si-O bonds or Si-ON bonds. An HMDS layer is then formed on the surface of the silicon nitride layer. A photo-resist layer is next formed on the surface of the HMDS layer. Finally, a soft bake process is performed to remove solvents from the photo-resist layer and an exposure process is performed on the photo-resist layer to define a predetermined pattern in the photo-resist layer.

11 Claims, 3 Drawing Sheets

METHOD FOR ENHANCING ADHESION OF PHOTO-RESIST TO SILICON NITRIDE SURFACES

BACKGROUND OF THE INVENTION

1. Field of the Invention

The present invention relates to a method for enhancing adhesion of photo-resist to silicon nitride surfaces. More particularly, the present invention relates to a method for enhancing adhesion of a photo-resist layer to a silicon nitride layer on a semiconductor wafer, and therefore improves the critical dimension performance of a silicon nitride layer during a lithographic process.

2. Description of the Prior Art

Lithography technology is in wide use at various steps during an integrated circuit fabrication process, and plays a central role in microcircuit technology. Typically, five to twenty complete lithographic operations are required on each wafer. To transfer the desired pattern from a patterned photo-mask to a wafer, the wafer is coated with a light-sensitive photo emulsion, known as photo-resist. The photo-resist coating process consists of spinning the wafer at high speed after a small quantity of pre-filtered photo-resist has been placed on it. The photo-resist film thickness is inversely proportional to the square root of the spin rate; typically, spinning speeds range from 1000 to 6000 rpm and result in photo-resist films that are about 0.5 to 3 m thick. The photo-resist becomes degraded upon exposure to ultraviolet light. The photo-resist film must adhere sufficiently well to the underlying film so that it does not lift off during subsequent processing. This is usually not a problem, provided that appropriate procedures are used for surface preparation.

Extreme care must be taken to use clean, dry wafers to obtain good adhesion of the photo-resist. A dehydration bake process is thus routinely performed for a couple minutes to remove residual water. A dip in a coupling agent, well known as a priming process, just prior to photo-resist application, is then used to enhance adhesion of the photo-resist to the surfaces, especially silicon dioxide surfaces, of the wafer. Hexamethyldisilizane, commonly abbreviated as HMDS, is often used for this purpose. Other adhesion promotors which can be used include trichlorophenylsilane, trichlorobenzene, and xylene. The coupling agent can also be applied by vapor-plating, in a bath process. By virtue of HMDS, the surface energy of a silicon dioxide layer on the wafer can be adjusted to a level that is approximately equivalent to that of the photo-resist so as to enhance the adhesion.

However, adhesion of the photo-resist to some surfaces, such as silicon nitride surfaces, often presents a serious problem, especially when the line width is below 0.15 m. Please refer to FIG.1. FIG.1 is a cross-sectional diagram of defined gate electrodes 14 having a cap nitride layer 16 on each gate electrode 14 by virtue of a photo-resist layer 16 and HMDS 22 on a semiconductor wafer 10 after performing a dry etching process according to the prior art method. As shown in FIG.1, the semiconductor wafer 10 comprises a silicon substrate 12 and a plurality of gate electrodes 14 with a 0.15 line width defined on the silicon substrate 12. Each gate electrode 14 comprises a gate oxide layer 19 on the silicon substrate 12, a polysilicon layer 18 on the gate oxide layer 19, and a cap nitride layer 16 on the polysilicon layer. On each cap nitride layer 16 a photo-resist layer 20, acting as a hard mask during the dry etching process, is formed and HMDS 22 between the photo-resist layer 20 and the cap nitride layer 16 is applied according to the prior art.

Despite the application of the HMDS 22 to the surfaces of the cap nitride layer 16, the photo-resist layers 20 are still lifted off during a routine wet cleaning process that is performed before the dry etching process that is used to define the gate electrodes 14. This causes a pattern transfer failure. In addition, variations of the critical dimension (CD) performance are usually observed when using typical optical printing methods on the cap nitride layer 16. This occurs because, gradually, native oxidation of the surface of the cap nitride layer changes the optical properties of the surface, such as the reflection index, on the cap nitride layer 16. The problems of photo-resist patterning on silicon nitride layer are especially severe. Consequently, an economic and effective solution to the above mentioned issues must be found.

SUMMARY OF THE INVENTION

It is therefore a primary objective of this invention to provide a method for enhancing adhesion of photo-resist to a silicon nitride surface.

Another objective of the invention is to provide a method for enhancing adhesion of the photo-resist to silicon nitride surfaces and, at the same time, improving the critical dimension performance of the silicon nitride surfaces during a lithographic process.

In accordance with the present invention, the silicon nitride layer is formed on a semiconductor wafer. The semiconductor wafer comprises a silicon substrate, a gate oxide formed on the silicon substrate, and a polysilicon layer formed on the gate oxide layer. Specifically, the silicon nitride layer is formed on the surface of the polysilicon layer. An oxidation process is first performed on the surface of the semiconductor wafer using an oxidant to transform most of the dangle bonds and Si-N bonds on the surface of the silicon nitride layer into Si-O bonds or Si-ON bonds. An HMDS (hexamethyl disilazane) layer is then formed on the surface of the silicon nitride layer. A photo-resist layer is next formed on the surface of the HMDS layer. Finally, a soft bake process is performed to remove solvents from the photo-resist layer and an exposure process is performed on the photo-resist layer to define a predetermined pattern in the photo-resist layer.

In the preferred embodiment according to this invention, the oxidation process is performed by using ozone-dissolved deionized water. The ozone acts as the oxidant.

In another embodiment according to this invention, the oxidant is an oxygen plasma. In still another embodiment according the present invention, the oxidant is a solution comprising hydrogen peroxide ($H_2O_2$) and sulfuric acid ($H_2SO_4$).

The most important feature of the present invention is that the surfaces of the silicon nitride layer are first subjected to an oxidation process before coating HMDS in order to transform most of the dangle bonds and Si-N bonds on the surface of the silicon nitride layer into Si-O bonds or Si-ON bonds so that the HMDS later applied to the surfaces of the silicon nitride layer will adhere more tightly to the silicon nitride layer. Thus, the adhesion of the photo-resist to the silicon nitride layer is significantly improved.

Furthermore, by controlling the time period of the oxidation process, all of the dangle bonds or Si-N bonds on the surface of the silicon nitride layer can be transformed into Si-O bonds or Si-ON bonds so that the optical properties across the surfaces of the silicon nitride layer are equalized. Thus, the critical dimension performance can be improved.

These and other objectives of the present invention will no doubt become obvious to those of ordinary skill in the art

DETAILED DESCRIPTION OF THE PREFERRED EMBODIMENT

Figure 1:
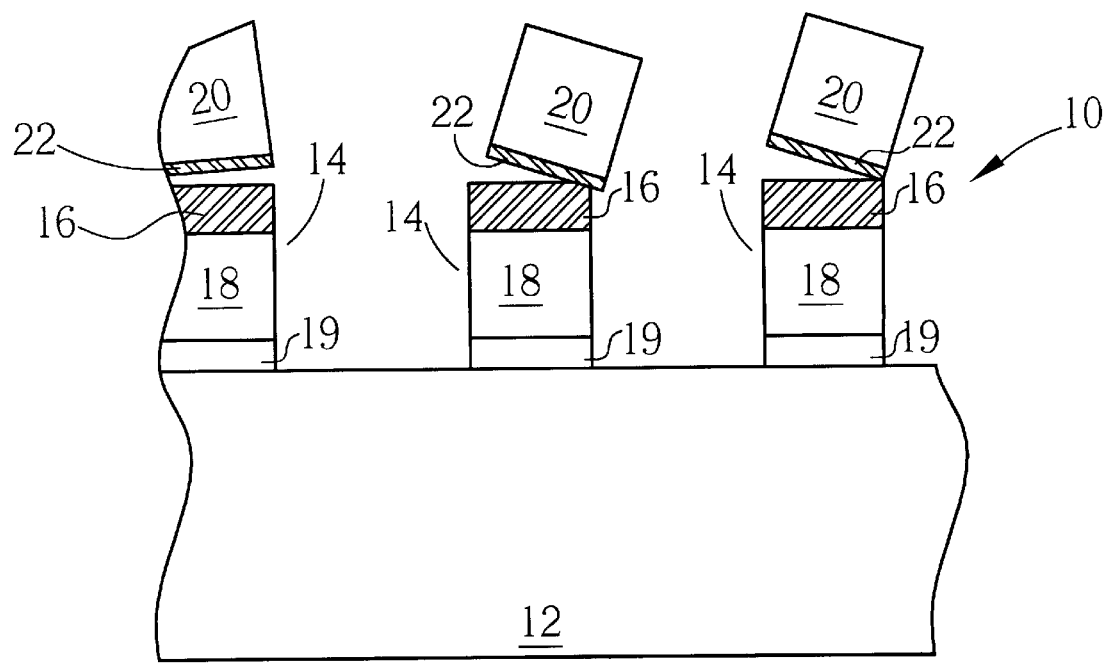
FIG.1 is a cross-sectional diagram of defined gate electrodes having a cap nitride layer on each gate electrode by virtue of a photo-resist layer and HMDS on a semiconductor wafer after performing a dry etching process according to the prior art method.
Figure 2:
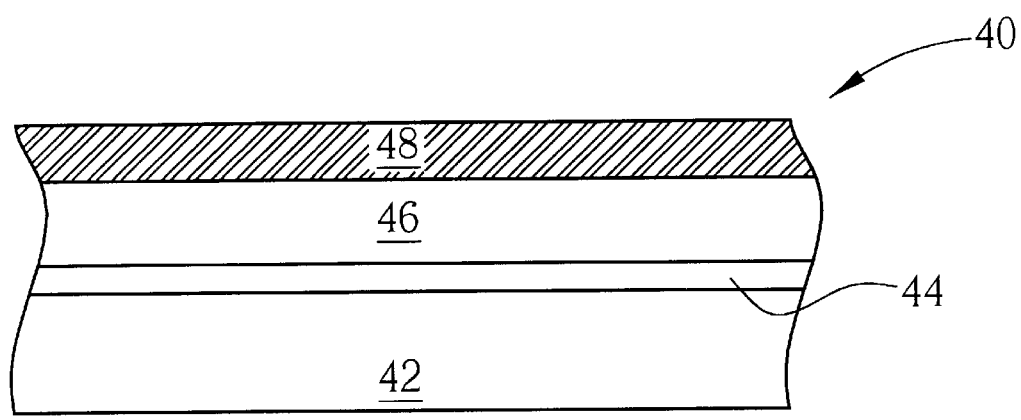
FIG.2 to FIG.6 are schematic diagrams of forming a gate electrode with a 0.15 m line width on a semiconductor wafer according to the present invention.

Please refer to FIG.2 to FIG.6. FIG.2 to FIG.6 are schematic diagrams of forming a gate electrode 56 with a 0.15 m line width on a semiconductor wafer 40 according to the present invention. As shown in FIG.2, an 80 to 200 angstroms thick gate oxide layer 44, a 1000 to 1500 angstroms thick polysilicon layer 46, and a 800 to 1000 angstroms thick silicon nitride layer 48 are sequentially formed on the surface of the silicon substrate 42 by means of a low-pressure chemical vapor deposition (LPCVD) process.

Subsequently, an oxidation process is performed on the surface of the silicon nitride layer 48 using an oxidant, such as ozone-dissolved deionized water with a concentration of ozone between 20 to 200 ppm (parts per million), that is sprayed onto the surface of the spinning semiconductor wafer 40 for about 5 to 60 minutes, preferably 30 minutes. Occasionally, sulfuric acid is also used in the oxidation process. After the oxidation process, most of the dangle bonds and Si-N bonds on the surface of the silicon nitride layer 48 are transformed into Si-O bonds or Si-ON bonds so that the HMDS later applied to the surfaces of the silicon nitride layer 48 can adhere more tightly to the silicon nitride layer 48.

Moreover, by controlling the time period of the oxidation process, all of the dangle bonds or Si-N bonds on the surface of the silicon nitride layer 48 can be transformed into Si-O bonds or Si-ON bonds so that the optical properties across the surfaces of the silicon nitride layer 48 are equalized. Thus, the critical dimension performance can be improved. A series of cleaning and drying processes are then carefully performed to obtain a dry and clean wafer 40.

Figure 3:
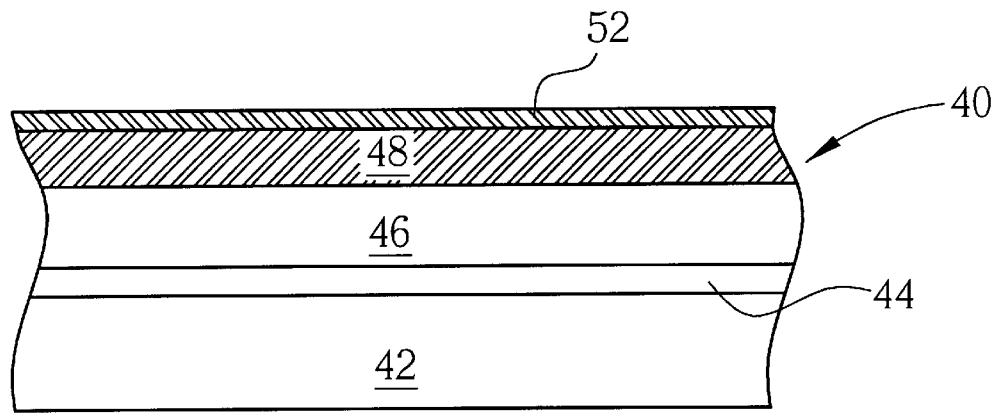
Figure 4:
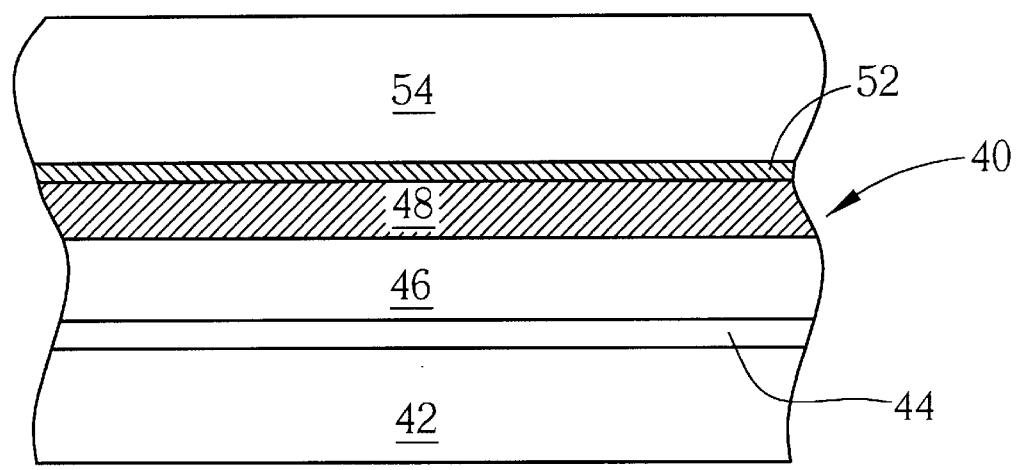
Figure 5:
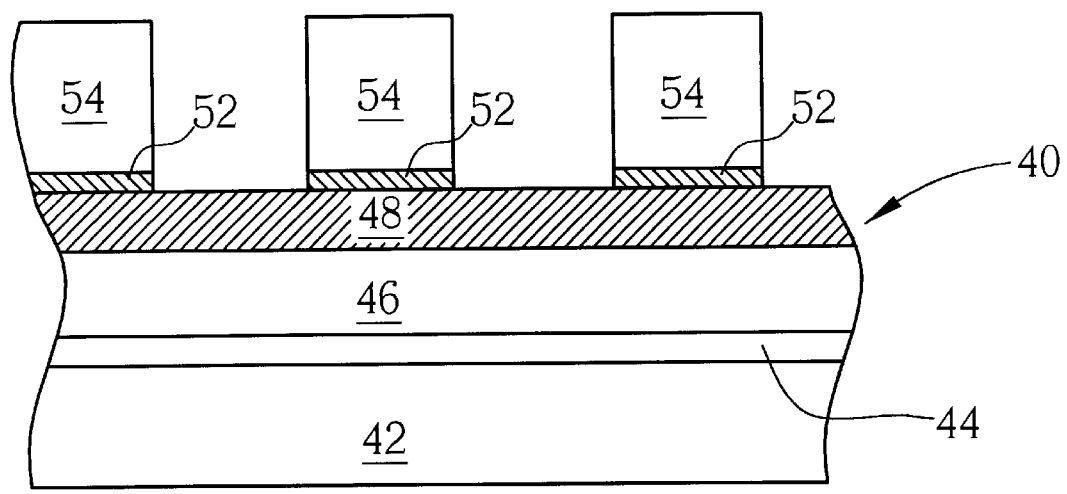

As shown in FIG.3, a thin HMDS layer 52 is formed on the oxidized surface of the silicon nitride layer 48 by means of a vapor-plating process or a spin coating process. A dehydration thermal process is then performed to solidify the HMDS layer 52. At this phase, since most of the dangle bonds and Si-N bonds on the surface of the silicon nitride layer 48 have been transformed into Si-O bonds or Si-ON bonds, the HMDS layer 48 adheres tightly to the silicon nitride layer 48. Next, as shown in FIG. 4, a positive photo-resist layer 54 with a thickness of about 1 m is formed on the HMDS layer 52 by means of a spin-coating process. A conventional softbake process is then performed to remove solvents from the photo-resist layer. The softbake temperature specified by most photo-resist manufacturers is 100 to 120° C., and must be carefully controlled since it affects the subsequent exposure time, as well as the time of development.

Figure 6:
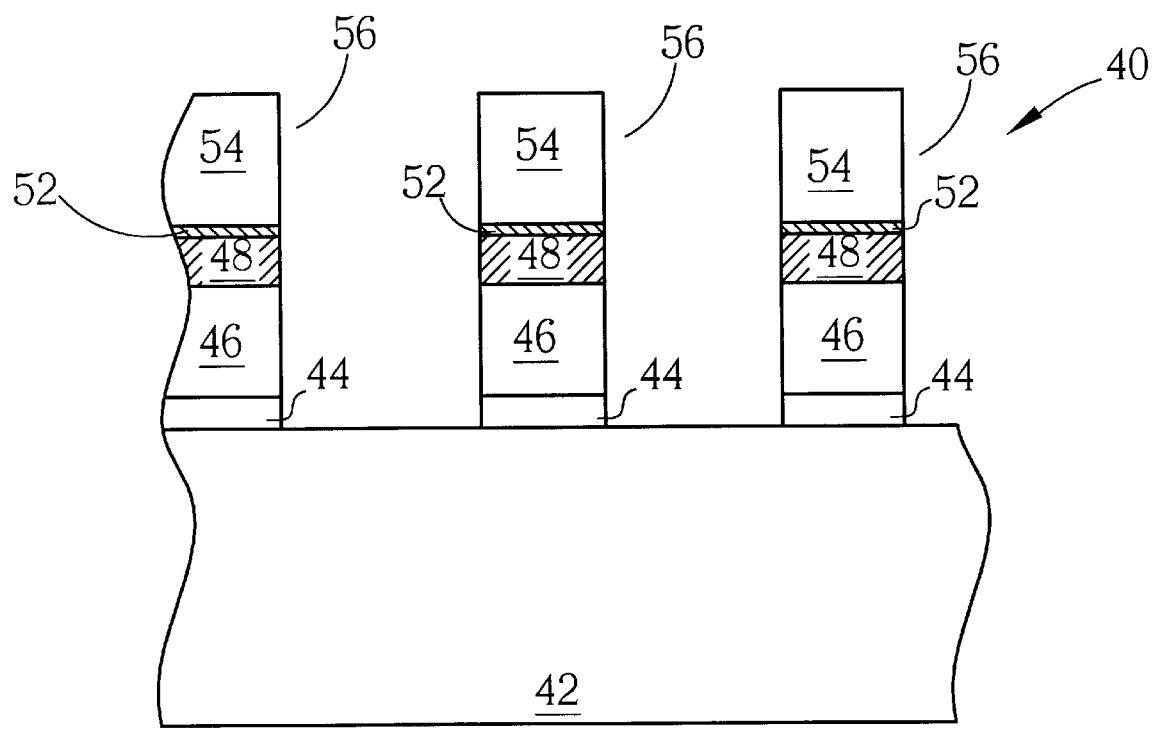

As shown in FIG. 6, a conventional lithographic process is used to form a desired gate electrode patterns with a line width of 0.15 m on the photo-resist layer 54. The lithographic process here includes an exposure process and a development process. Finally, as shown in FIG.7, an anisotropic dry etching process is performed to etch the silicon nitride layer 48, the polysilicon layer 46 and the gate oxide layer 44 that are not covered by the photo-resist layer 54 down to the surface of the silicon substrate 42, thereby forming a well-defined gate electrode 56 on the semiconductor wafer 40.

In another embodiment of the present invention, the oxidant is an oxygen plasma. The oxygen plasma is created under the following conditions: (1) a top power of 500 to 1500 W; (2) a temperature of 100 to 300° C.; and (3) an oxygen flow rate of 1000 to 10000 sccm (standard cubic centimeters per minute). In still another embodiment according to the present invention, the oxidant is a solution comprising hydrogen peroxide ($H_2O_2$) and sulfuric acid ($H_2SO_4$). The solution is an $H_2O_2$:$H_2SO_4$=1:2 to 1:5 (v/v) solution.

Comparing the present invention to the prior art, the difference between them is an additional oxidation process performed on the surface of the semiconductor wafer 40 that transforms most of the dangle bonds and Si-N bonds on the surface of the silicon nitride layer 48 into Si-O bonds or Si-ON bonds. An HMDS layer 52, usually used in the prior art, is then formed on the surface of the silicon nitride layer 48 after performing the oxidation process.

Furthermore, by controlling the time period of the oxidation process, all of the dangle bonds or Si-N bonds on the surface of the silicon nitride layer can be transformed into Si-O bonds or Si-ON bonds so that the optical properties across the surfaces of the silicon nitride layer 48 are equalized. The critical dimension performance is therefore improved and the minimum feature size requirements for microcircuits are met.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for enhancing adhesion of photo-resist to the surface of a silicon nitride layer on a semiconductor wafer, the method comprising:

performing an oxidation process on the surface of the semiconductor wafer using an oxidant to transform most of the dangle bonds and Si-N bonds on the surface of the silicon nitride layer into Si-O bonds or Si-ON bonds, wherein the oxidation process is performed by contacting the semiconductor wafer with a solution comprising ozone-dissolved deionized water, sulfuric acid or hydrogen peroxide;

forming an HMDS (hexamethyl disilazane) layer on the surface of the silicon nitride layer;

forming a photo-resist layer on the surface of the HMDS layer; and performing a soft bake process to remove solvents from the photo-resist layer.

2. The method of claim 1 wherein the semiconductor wafer comprises a silicon substrate, a gate oxide layer formed on the silicon substrate, and a polysilicon layer formed on the gate oxide layer, the silicon nitride layer being formed on the surface of the polysilicon layer.

3. The method of claim 1 wherein the concentration of ozone in the ozone-dissolved deionized water is between 20 to 200 ppm (parts per million).

4. The method of claim 1 wherein the oxidation process is performed for about 5 to 60 minutes.

5. The method of claim 1 wherein the solution is an $H_2O_2:H_2SO_4=1:2$ to 1:5 (v/v) solution.

6. A method for improving the critical dimension (CD) performance of a silicon nitride layer during a lithographic process, the silicon nitride layer being formed on the surface of a semiconductor wafer, the method comprising:

performing an oxidation process by using an oxidant to transform all of the dangle bonds and Si-N bonds on the surface of the silicon nitride layer into Si-O bonds or Si-ON bonds, wherein the oxidant comprises ozone, sulfuric acid or hydrogen peroxide;

forming an HMDS layer on the surface of the silicon nitride layer;

forming a photo-resist layer on the surface of the HMDS layer;

performing a soft bake process to remove solvents from the photo-resist layer; and performing an exposure process on the photo-resist layer to define a predetermined pattern in the photo-resist layer;

wherein by controlling the time period of the oxidation process, substantially all of the dangle bonds or Si-N bonds on the surface of the silicon nitride layer can be transformed into Si-O bonds or Si-ON bonds so that the optical properties across the surfaces of the silicon nitride layer are substantially equalized, thereby improving the critical dimension performance.

7. The method of claim 6 wherein the semiconductor wafer comprises a silicon substrate, a gate oxide layer formed on the silicon substrate, and a polysilicon layer formed on the gate oxide layer, the silicon nitride layer being formed on the surface of the polysilicon layer.

8. The method of claim 6 wherein the concentration of ozone in the ozone-dissolved deionized water is between 20 to 200 ppm (parts per million).

9. The method of claim 6 wherein the oxidation process is performed for about 5 to 60 minutes.

10. The method of claim 6 wherein the solution is an $H_2O_2:H_2SO_4=1:2$ to 1:5 (v/v) solution.

11. The method of claim 6 wherein the temperature during the soft bake process is between 100 to 120° C.

* * * * *